(12) United States Patent
Rothman

(10) Patent No.: US 9,406,831 B2
(45) Date of Patent: Aug. 2, 2016

(54) AVALANCHE PHOTODIODE SEMICONDUCTOR STRUCTURE HAVING A HIGH SIGNAL-TO-NOISE RATIO AND METHOD FOR MANUFACTURING SUCH A PHOTODIODE

(71) Applicant: Commissariat a l'energie atomique et aux energies alternatives, Paris (FR)

(72) Inventor: Johan Rothman, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/758,707

(22) PCT Filed: Dec. 27, 2013

(86) PCT No.: PCT/EP2013/078088
§ 371 (c)(1),
(2) Date: Jun. 30, 2015

(87) PCT Pub. No.: WO2014/102353
PCT Pub. Date: Jul. 3, 2014

(65) Prior Publication Data
US 2015/0340537 A1 Nov. 26, 2015

(30) Foreign Application Priority Data
Dec. 31, 2012 (FR) ...................................... 12 62991

(51) Int. Cl.
*H01L 31/10* (2006.01)
*H01L 31/107* (2006.01)
(Continued)

(52) U.S. Cl.
CPC ...... *H01L 31/1075* (2013.01); *H01L 31/02966* (2013.01); *H01L 31/1832* (2013.01)

(58) Field of Classification Search
CPC ..................... H01L 31/02966; H01L 31/1832; H01L 31/107; H01L 31/1032
See application file for complete search history.

(56) References Cited

U.S. PATENT DOCUMENTS

| 4,984,032 A | 1/1991 | Miura et al. |
| 6,747,296 B1 | 6/2004 | Clark |

(Continued)

FOREIGN PATENT DOCUMENTS

| CA | 1 298 640 | 4/1992 |
| EP | 0 325 532 | 7/1989 |

OTHER PUBLICATIONS

U.S. Appl. No. 14/402,020, filed Nov. 18, 2014, Boulard et al.
(Continued)

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A semiconductor structure, and method for manufacturing, of avalanche photodiode type for receiving electromagnetic radiation in a given wavelength range and including a first semiconductor area configured for absorption of the electromagnetic radiation, a second area configured for providing a multiplication of carriers, and a third semiconductor area in contact with the second semiconductor area. The second area includes at least two subparts with the second subpart configured to have a mean carrier multiplication rate that is more substantial than that of the first subpart.

6 Claims, 2 Drawing Sheets

(51) Int. Cl.
*H01L 31/0296* (2006.01)
*H01L 31/18* (2006.01)

(56) References Cited

U.S. PATENT DOCUMENTS

| 8,772,717 B2* | 7/2014 | Mitra ............... H01L 31/02966 250/338.1 |
| 2014/0319580 A1 | 10/2014 | Mollard et al. |
| 2014/0339570 A1 | 11/2014 | Mollard et al. |
| 2014/0346539 A1 | 11/2014 | Mollard et al. |

OTHER PUBLICATIONS

Singh, A., et al., "HgCdTe avalanche photodiodes: A review", Optics & Laser Technology, vol. 43, (2011), pp. 1358-1370, XP028384723.

Wang, S., et al., "Low-Noise Avalanche Photodiodes With Graded Impact-Ionization-Engineered Multiplication Region", IEEE Photonics Technology Letters, vol. 13, No. 12, (Dec. 2001), pp. 1346-1348, XP011426604.

Rothman, J., et al., "Short-Wave Infrared HgCdTe Avalanche Photodiodes", Journal of Electronic Materials, (2012), (Total pp. 9).

Rothman, J., et al., "History-Dependent Impact Ionization Theory Applied to HgCdTe e-APDs", Journal of Electronic Materials, vol. 40, No. 8, (2011), pp. 1757-1768.

French Search Report Issued Oct. 22, 2013 in French Patent Application 1262991 Filed Dec. 31, 2012.

International Search Report Issued Aug. 5, 2014 in PCT/EP2013/078088 Filed Dec. 27, 2013.

* cited by examiner

AVALANCHE PHOTODIODE SEMICONDUCTOR STRUCTURE HAVING A HIGH SIGNAL-TO-NOISE RATIO AND METHOD FOR MANUFACTURING SUCH A PHOTODIODE

TECHNICAL FIELD

The invention relates to the field of devices for measuring and detecting light.

In the last few years, the application of methods for manufacturing microelectronics to direct gap semiconductor materials have made it possible to improve the performance of optoelectronic structures.

Among these optoelectronic structures, avalanche photodiodes have improved sensitivity with a sharp drop in dark current. Nevertheless, despite the improvement in this sensitivity, detecting single photons at ambient temperature still remains difficult with such structures.

As such, the improvement in the sensitivity of avalanche photodiodes remains a current problem.

The invention therefore relates more particularly to an avalanche photodiode semiconductor structure having a high signal-to-noise ratio and to a method for manufacturing such a structure.

PRIOR ART

In the last few years, various avenues for research have been explored in order to improve avalanche photodiode structures, and this with the purpose of improving the possibilities of detecting single photons at ambient temperature.

A major step towards such structures was made with the arrival of materials, such as mercury-cadmium tellurides, making it possible to obtain a preponderant carrier multiplication by impact ionisation for a single type of carriers.

Indeed, such materials make it possible to prevent, as have been demonstrated particularly in the work of J. Rothman and his colleagues published in 2011 in the Journal of Electronic Material, No. 40, page 1757, parasite interaction between the two types of carriers circulating in the multiplication area. The result of this is a substantial reduction in the noise generated in this area and improved response time.

A structure comprising such a material in the zone intended for the multiplication of carriers generally comprises:
  a first semiconductor area of a first type of conductivity having a first face for receiving the electromagnetic radiation and a second face opposite the first face, the semiconductor material in which is formed said first area having an energy band gap suitable for allowing the absorption of the electromagnetic radiation,
  a second semiconductor area in contact with the second face of the first area, the second area having a minority carrier concentration that is less than that of the first area, said second area being suitable for providing a multiplication of carriers by impact ionisation that is preponderant for one type of carrier,
  a third semiconductor area in contact with the second semiconductor area, said third area being of a second type of conductivity opposite the first type of conductivity and having a majority carrier concentration that is greater than that of the second semiconductor area.

Nevertheless, although this type of structure has an improved sensitivity with regards to an avalanche photodiode structure that does not comprise a second area suitable for providing a multiplication of carriers by impact ionisation that is preponderant for one type of carrier, the sensitivity of such a structure is still not sufficient for certain applications, such as detecting single photons at ambient temperature.

DISCLOSURE OF THE INVENTION

This invention aims to overcome these disadvantages.

The invention therefore has for purpose to provide an avalanche photodiode that has an increased signal-to-noise ratio with regards to a structure according to prior art which has an identical gain in the multiplication of carriers.

To this effect, the invention relates to an avalanche photodiode semiconductor structure for receiving electromagnetic radiation in a given wavelength range and comprising:
  a first so-called absorption semiconductor area, of a first type of conductivity having a first face for receiving the electromagnetic radiation and a second face opposite the first face, the semiconductor material in which is formed said first area having an energy band gap suitable for allowing the absorption of the electromagnetic radiation,
  a second so-called multiplication semiconductor area, in contact with the second face of the first area, the second area having a majority carrier concentration that is less than that of the first area, said second area being suitable for providing a multiplication of carriers by impact ionisation that is preponderant for one type of carrier,
  a third so-called collection semiconductor area, in contact with the second semiconductor area, said third area being of a second type of conductivity opposite the first type of conductivity and having a majority carrier concentration that is higher than that of the second semiconductor area,
  the second area comprises at least two subparts, a first subpart through which the second area is in contact with the first area and a second subpart connecting the first subpart to the third area, the second subpart being suitable for having a mean carrier multiplication rate by micrometer that is greater than the mean carrier multiplication rate by micrometer of the first subpart, and preferentially greater than 3 times, 5 times, even 10 times the mean carrier multiplication rate by micrometer of the first subpart.

It is meant hereinabove and in the rest of this document by the fact that the second subpart connects the first subpart to the third area, either that the second subpart directly connects the first subpart to the third area and therefore that the second subpart acts as an interface between the first subpart and the third area, or that the second subpart connects with another part of the second area, such as a minor part of the second area, the first subpart with the third area.

It is meant hereinabove and in the rest of this document by mean carrier multiplication rate by micrometer of a part of the second area, the average number of carriers generated by impact ionisation in said part of the second area by one carrier during its transit in said part of the second area divided by the mean travel distance travelled by a carrier transiting in this same part of the second area, and this during the operation of the structure. Of course, the structure is considered to be operating when it is subjected to a nominal operating polarisation, such as a polarisation of 12V.

"Multiplication of carriers par impact ionisation that is preponderant for one type of carrier" means that the multiplication by impact of one of the types of carriers is negligible with regards to the multiplication by impact of the other type of carrier, i.e. the ratio between the two multiplication rates is greater than 50, preferentially 100, even 1000. As such, such a preponderance can extend up to a suppression of the impact ionisation of the other type of carrier, with the multiplication by the impact taking place only for one type of carrier, not for the second type of carrier.

As such, the carriers generated in the first area, during their transit to the third area, pass in turn the first subpart and the second subpart. The first subpart, by having a reduced mean carrier multiplication rate by micrometer, makes it possible to increase the carrier current with a reduction in the signal-to-noise ratio that remains contained. The carrier current is as such slightly increased with a signal-to-noise ratio that remains substantial. The carrier current then transits by the second subpart wherein it is significantly increased by the strong mean carrier multiplication rate by micrometer that the second subpart has.

The second area can have a majority carrier concentration at least less than 10 times that of the first area.

The third area can have a majority carrier concentration at least 10 times greater than that of the second semiconductor area.

The noise generated in this second subpart, although it is significantly substantial with regards to that generated in the first subpart, remains reduced in relation to the carrier current after it was increased by its passage in the first subpart. As such, the structure has a substantial gain in the multiplication of carrier current, which is of a magnitude of that generated by the second subpart, with a reduction in the signal-to-noise ratio which remains contained and the latter which is of a magnitude of the signal-to-noise ratio at the output of the first subpart. Such a structure therefore has an improved sensitivity with regards to a structure according to prior art that has a second area suitable for providing a multiplication of carriers by impact ionisation that is preponderant for one type of carrier, with the multiplication of the other type of carrier being negligible.

It is meant hereinabove by gain in multiplication of carriers in a given part or area, the average number of carriers generated by impact ionisation in said part or area during the transit of one carrier in this same part or area.

Alternatively, the invention can also relate to an avalanche photodiode semiconductor structure for receiving electromagnetic radiation in a given wavelength range and comprising:

a first so-called absorption semiconductor area, of a first type of conductivity having a first face for receiving the electromagnetic radiation and a second face opposite the first face, the semiconductor material in which is formed said first area having an energy band gap suitable for allowing the absorption of the electromagnetic radiation, a second so-called multiplication semiconductor area, in contact with the second face of the first area, the second area having a majority carrier concentration that is less than that of the first area, said second area is suitable for providing a multiplication of carriers par impact ionisation that is preponderant for one type of carrier, a third so-called collection semiconductor area, in contact with the second semiconductor area, said third area being of a second type of conductivity opposite the first type of conductivity and having a majority carrier concentration that is greater than that of the second semiconductor area, the second area comprises at least two subparts, a first subpart through which the second area is in contact with the first area and a second subpart connecting the first subpart to the third area, the second subpart being suitable for having a carrier multiplication rate that is greater than that of the first subpart, and preferentially greater than 3 times, 5 times, even 10 times the carrier multiplication rate of the first subpart, the first and the second subpart having thicknesses of the same order of magnitude.

It is meant hereinabove and in the rest of this document by carrier multiplication rate by a part of the second area, the average number of carriers generated by impact ionisation in said part of the second area by one carrier during its transit in said part of the second area, and this during the operation of the structure.

It can be noted that, for a first and a second sublayer having thicknesses of the same order of magnitude, the ratio of mean carrier multiplication rate by micrometer between the first and the second sublayer has a value similar to that of the ratio of carrier multiplication rate between these first and second subparts.

The first, second and third areas (210, 310, 410) can all three be made from mercury-cadmium tellurides of the $Cd_xHg_{1-x}Te$ type with proportions x in cadmium that are different from one another, with the first type of conductivity being a type of conductivity wherein the majority carriers are holes, providing in this way that the impact ionisation in the second area is preponderant for the electrons.

The second subpart can be made from a semiconductor material having an energy band gap that is less than that of the semiconductor material in which is formed the first subpart in such a way as to have the mean carrier multiplication rate by micrometer greater than that of the first subpart.

Such a variation in the energy band gap between the first and the second subpart of the second area makes it possible to provide a first and a second subpart with mean carrier multiplication rates by micrometer different from one another.

The first and the second subpart can be made from mercury-cadmium tellurides of the $Cd_xHg_{1-x}Te$ type with proportions x in cadmium that are different from one another.

A first and a second subparts made from mercury-cadmium tellurides make it possible to provide a second area which has a carrier multiplication by impact ionisation that is preponderant for the electrons with the second subpart which has an energy band gap less than that of the first subpart. In addition, the interface between the first and the second subpart is substantially free of crystal defects and therefore does not generate a significant dark current. Indeed mercury-cadmium tellurides have, among other advantages, a substantial variation in the energy band gap by varying the proportion of cadmium without a significant variation in the parameters of the crystal lattice structure.

The first and the second subparts can have concentrations in majority carriers that are substantially identical.

The first and the second subparts of the first area can have the second type of conductivity.

The first subpart can have the first type of conductivity, the second subpart having the second type of conductivity.

The first and the second subpart can have the first type of conductivity.

The first and the second subpart can be realised in the same semiconductor material and be of the second type of conductivity with a majority carrier concentration of the same order of magnitude, with the first and the second subparts being separated from one another by an interface area of the first type of conductivity with a majority carrier concentration suitable for modifying the distribution of the electric field in the second subpart so that the latter has a mean carrier multiplication rate by micrometer that is greater than that of the first subpart, the second subpart having a mean carrier multiplication rate by micrometer that is greater by at least 3 times and preferentially 5 times, even 10 times, that of the first subpart.

The mean carrier multiplication rates by micrometer that are different for the first and the second subpart in such a structure are as such obtained without it being necessary to use different materials in order to form the two subparts, which limits the risks of crystal defects appearing at the interface of these two subparts. Indeed, this type of defect is generally linked to an interface between two materials having a substantial difference in crystal lattice structures.

The first subpart can have a gain in multiplication of carriers between 2 and 10, the second subpart having a gain of multiplication of carriers between 10 and 500.

The structure can furthermore be for receiving electromagnetic radiation in a second wavelength range of energies that are less than those of the first wavelength range, the second subpart of the second area comprising an energy band gap that is less than the first semiconductor area and that of the first subpart and which is suitable for allowing the absorption of the electromagnetic radiation in the second wavelength range.

Such a structure makes it possible to effectively detect and measure an electromagnetic radiation of which the wavelength is included in the given wavelength range, the carriers generated by such a radiation being multiplied in the second area. It also makes it possible to detect and to measure an electromagnetic radiation of which the wavelength is included in the second wavelength range.

The first and the second subpart of the first area are both layers of which the minimum thickness is greater than 200 nm.

Such thicknesses make it possible to provide a significant gain for each one of these subparts of the second area. Indeed, 200 nm being, for mercury-cadmium tellurides, the mean free travel distance between 2 ionisations, with each carrier entering into one of the first and of the second subparts of the second area should generate at least one impact ionisation, as such making it possible to obtain a significant gain.

The invention also relates to a method for manufacturing a semiconductor structure as claimed in any preceding claim comprising the steps consisting in:
  providing a first semiconductor area of a first type of conductivity having a first face for receiving the electromagnetic radiation and a second face opposite the first face, the semiconductor material in which is formed said first area having an energy band gap suitable for allowing the absorption of the electromagnetic radiation,
  forming a second semiconductor area in contact with the second face of the first area, the second area having a majority carrier concentration that is less than that of the first area, said second area suitable for providing a multiplication of carriers by impact ionisation that is preponderant for one type of carrier, the second area comprising at least two subparts, a first subpart through which the second area is in contact with the first area and a second subpart for connecting the first subpart to the third area, the second subpart being suitable for having a mean carrier multiplication rate by micrometer that is greater than the mean carrier multiplication rate by micrometer of the first subpart, and preferentially greater than 3 times, 5 times, even 10 times the mean carrier multiplication rate by micrometer of the first subpart.
  forming a third semiconductor area in contact with the second semiconductor area, said third area being of a second type of conductivity opposite the first type of conductivity and having a majority carrier concentration that is greater than that of the second semiconductor area.

Such a method makes it possible to provide a structure that therefore has improved sensitivity with regards to a structure according to prior art comprising a second area suitable for providing a multiplication of carriers by impact ionisation that is preponderant for one type of carrier.

As the second area can be formed in a mercury-cadmium telluride of the $Cd_xHg_{1-x}Te$ type, the step of forming the second area can comprise a substep of forming the first subpart in a mercury-cadmium telluride with a first proportion $x_1$ in cadmium and a substep of forming the second subpart in a mercury-cadmium telluride with a second proportion $x_2$ in cadmium which is less than the first proportion $x_1$ in cadmium.

Such substeps make it possible to provide a structure with a second area that, while still having a multiplication of carriers by impact ionisation that is preponderant for the electrons with the second subpart which has an energy band gap greater than that of the first subpart, comprises an interface between the first and the second subpart substantially exempt of crystal defects. Indeed the mercury-cadmium tellurides allow for a substantial variation in the energy band gap by varying the proportion of cadmium without a significant variation in the parameters of the crystal lattice structure.

BRIEF DESCRIPTION OF THE DRAWINGS

This invention shall be better understand when reading the description of embodiments, provided solely for the purposes of information and in no way restricted, in reference to the annexed drawings wherein.

The various parts shown in the figures are not necessarily shown according to a uniform scale, in order to make the figures more legible.

The various possibilities (alternatives and embodiments) must be understood as not being exclusive from one another and can be combined together.

DETAILED DISCLOSURE OF PARTICULAR EMBODIMENTS

Figure 1:
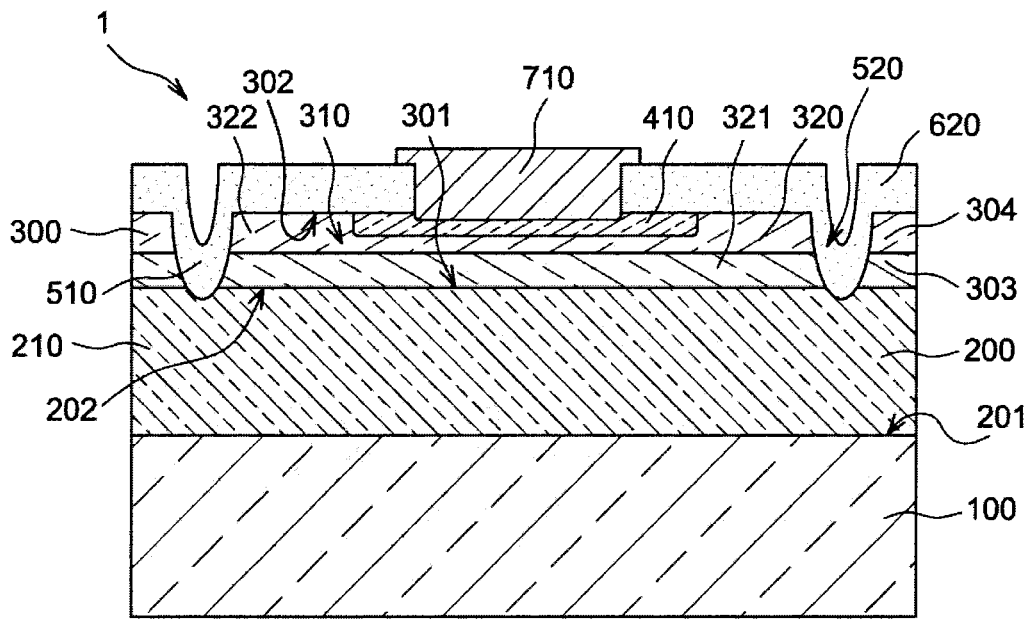
FIG. 1 shows a cross-section view of a structure according to a first embodiment of the invention, FIG. 2 graphically shows the variation of the multiplication rate of a multiplication zone of mercury-cadmium telluride of a structure of prior art, this according to both the polarisation voltage of the structure and of the cutoff frequency of the second semiconductor layer, this figure is extracted from the article by J. Rothman et al. published in the scientific journal "Journal of Electronic Materials" no. 42 p 2928 in 2012.

FIG. 1 shows a semiconductor structure 1 according to a first embodiment, said structure 1 being intended for the detecting and measuring of an electromagnetic radiation of which the wavelength is included in a given wavelength range.

In order to show and facilitate the understanding of the operation of the structure according to the invention, the values and the materials which are mentioned hereinbelow, when this is stated, relate to a particular application of the invention for the detecting and measuring of electromagnetic radiation of which the wavelength is included in the near-infrared wavelength range. Of course, the values and the materials relating to this application are provided solely for the purposes of information and are not restrictive.

It is meant hereinabove and in the rest of this document by near-infrared wavelength range a wavelength range between 0.8 µm and 3 µm.

A structure 1 according to the first embodiment of the invention comprises:
- a support 100,
- a first semiconductor area 210 of a first type of conductivity having a first face 201 for receiving the electromagnetic radiation and a second face 202 opposite the first face 201, said first area 210 comprising an energy band gap suitable for allowing the absorption of the electromagnetic radiation,
- a second semiconductor area 310 in contact via a first longitudinal face 301 with the second face 202 of the first area 210, the second area 310 comprising a first and a second subpart 321, 322, the second area 310 being in contact with the first area 210 by its first subpart 321,
- a third semiconductor area 410 in contact with the second subpart 322 of the second semiconductor area 310, said third area 410 being of a second type of conductivity opposite the first type of conductivity,
- a cavity 520 surrounding the second area 310,
- an electrical contact 710 in contact with the third area 410 and suitable for polarising the third area 410, with the electrical contact forming a first means of polarisation,
- a second means of polarisation, not shown, suited for polarising the first area 210,
- a passivation layer 620 in contact with the second and third areas 310, 410.

The support 100 is a support suitable for forming the first area 210 and is at least partially transparent in the given wavelength range. As such the support 100 can be realised in an insulating or semiconductor material of which the energy band gap is suitable to be greater than the energy of the photons of an electromagnetic radiation of which the wavelength is in the given wavelength range.

In the particular application the support 100 can be made from zinc-cadmium telluride CdZnTe. Indeed, the zinc-cadmium telluride CdZnTe material has an energy band gap of at least 1.4 eV, and is therefore transparent to infrared and little sensitivity to thermal noise.

The support 100 has a first and a second face, the first face being the face which is for receiving the electromagnetic radiation.

The structure 1 further comprises a first semiconductor layer 200 in contact with the support. The first layer 200 is made from a semiconductor material of which the energy band gap is suitable for allowing the absorption of the electromagnetic radiation of which the wavelength is included in the given wavelength range. As such the first layer 200 is carried out in a semiconductor material of which the energy band gap is less than the energy of the photons of an electromagnetic radiation of which the wavelength is included in the given wavelength range.

The first layer 200 is of a first type of conductivity. The first type of conductivity is chosen from among the type of conductivity for which the majority carriers are electrons and the type of conductivity for which the majority carriers are holes.

The thickness of the first layer 200 is suitable so that a major part of a radiation received by the first face of the structure 1 on the first area 210 is absorbed by the first area 210.

In the particular application, the first layer 200 is formed in a mercury-cadmium telluride $Cd_xHg_{1-x}Te$ of which the proportion in cadmium x is between 0.33 and 0.6. With a proportion of cadmium of 0.33 and 0.6, the first layer is suitable for absorbing at a temperature of 300 K an electromagnetic radiation in a wavelength range that is respectively less than 3.7 µm and less than 1.8 µm.

In this same particular application, the first type of conductivity is of the type of conductivity for which the majority carriers are holes. The majority carrier concentration in the first layer 200 is preferentially between $10^{16}$ and $10^{17}$ cm$^{-3}$. According to this application, the first layer 210 has a thickness between 0.5 and 2 µm.

According to this same particular application, the first layer, in order to obtain the first type of conductivity, comprises dopant elements, such as arsenic As, gold Au or antimony Sb, which are suitable for giving at least one carrier corresponding to the first type of conductivity when they are activated.

The part of the first layer 210 wherein the electron-hole pairs are generated which are at the origin of the signal of the structure forms the first area 210 of the structure 1.

The first layer 200 has a first and a second face 201, 202, the first face 201 being the face via which the first layer 200 is in contact with the support 100. The first layer 200 is in contact via its second face 202, which is opposite its first face 201, with a second semiconductor layer 300. The second layer 300 comprises a longitudinal first face 301 through which it is in contact with the second face 202 of the first layer 100.

The second layer 300 is a semiconductor layer wherein are formed the second and third areas 310, 410. The second layer, except for its part forming the third area 410, is suitable to form a multiplier layer of carriers during the operation of the structure 1. In order to obtain such an adaptation, the part of the second layer 300 that forms the second area 310 comprises a majority carrier concentration which is at least 10 times less than that of the first area 210 and preferentially 50 times less. The second area 300, according to the operating constraints of the structure 1 can be of the first type of conductivity or of a second type of conductivity which is opposite the first type of conductivity.

According to another possibility of the invention, the part of the second layer 300 that forms the second area 310 can be of the intrinsic type or of the non-intentionally doped type.

According to other possibilities, which shall not be developed in this document, the second layer 310 can comprise a first and a second sublayer 303, 304 having respectively the first type of conductivity and an opposite second type of conductivity, or of the intrinsic type and of the first type of conductivity, or of the first type of conductivity and of the intrinsic type or even of the intrinsic type and of the second type of conductivity.

"Intrinsic type" means that the part of the second layer 300 that forms the second area 310 comprises a carrier concentration of a first type which is substantially identical to the carrier concentration of a second type which is opposite the first type of carriers.

"Non-intentionally doped type" means that the majority carrier concentration in the part of the second layer 300 that forms the second area 310 is that of a material wherein dopant elements have not intentionally been introduced, i.e. elements suitable to provide carriers. The concentration and the type of majority carriers in an area of the non-intentionally doped type are linked to the method of forming said area.

The second layer 300 comprises a first and a second sublayer 303, 304. The first and the second sublayer 303, 304 are the underlayers through which the second layer 300 is in respective contact with the first semiconductor layer 200 and the passivation layer 620.

The first and the second sublayer 303, 304 respectively comprise the first and the second subpart 321, 322 of the second area 310.

The first and the second sublayer 303, 304 are adapted in such a way that the second subpart 322 has a mean carrier multiplication rate by micrometer that is greater than that of the first subpart, the mean carrier multiplication rate by micrometer of the second subpart being preferentially greater than at least 3 times, 5 times, even 10 times, that of the first subpart 321. To this effect, the second sublayer 304 comprises an energy band gap less than that of the first sublayer 303.

The ratios of mean carrier multiplication rate by micrometer given hereinabove are during the operation of the structure 1. The structure 1 is considered to be in operation when its polarisation has a nominal operating voltage, such as for example 12 V.

Likewise, for a first and a second subpart 321, 322 having thicknesses of the same order of magnitude, or preferentially substantially identical, a ratio of the carrier multiplication rates between said first and second subparts 321, 322 is equivalent to the ratio of the mean carrier rates by micrometer between these two same subparts 321, 322. As such, in this configuration of the first and second subparts, the second subpart 322 has a carrier multiplication rate at least greater than 3 times, 5 times, preferentially 10 times, the mean carrier multiplication rate of the first subpart 321.

The thickness of each of the first and of the second subpart 321, 322 is preferentially greater than 200 nm.

Figure 2:
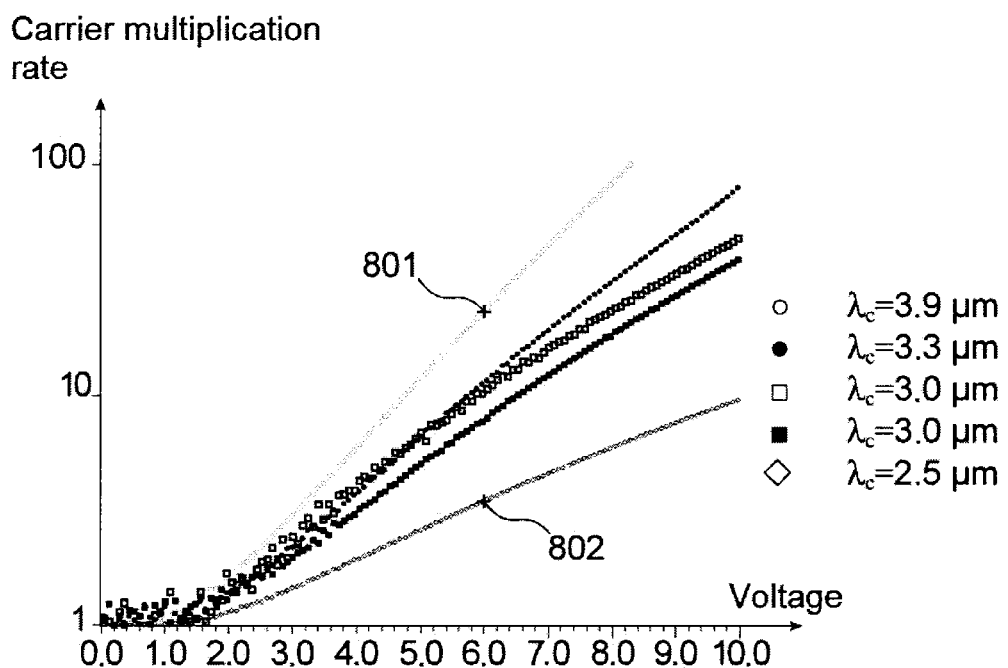

The FIG. 2 as such graphically shows the variation in the carrier multiplication rate of a multiplication area in mercury-cadmium telluride of a structure of prior art according to both the cutoff wavelength $\lambda_c$ of said area, which corresponds directly to its energy band gap of this same area, and the polarisation voltage of the structure. This figure comes from an article by J. Rothman et al. published in the scientific journal "Journal of Electronic Materials" no. 42 p 2928 in 2012. For a structure comprising a first and a second subpart 321, 322 each having characteristics identical to that of an area of multiplication of FIG. 4 and for a polarisation voltage of 12V applied to the structure, the voltage drop will be distributed equally along the two subparts 321, 322. As such, the multiplication rates along such first and second subparts with such a polarisation voltage corresponding to those of the multiplication areas according to FIG. 4 which comprises the same cutoff wavelength $\lambda_c$ at the polarisation voltage of the structure divided by two, i.e. a voltage of 6 V.

As such, for example for a first subpart 321 of which the cutoff length $\lambda_c$ is 2.5 μm, which corresponds to an energy band gap of 0.45 eV, and a second subpart 322 of which the cutoff wavelength $\lambda_c$ is 3.9 μm, which corresponds to an energy band gap of 0.32 eV, the multiplication rates are respectively 2 (see point 802 in FIG. 2) and 20 (see point 801 in FIG. 2). Ratios of carrier multiplication rate between the first and the second subpart 321, 322 and mean carrier multiplication rates between these two same parts equal to 10 are thus obtained.

In order to obtain these conditions, in the particular application, the first and the second sublayer 303, 304 are both made from a mercury-cadmium telluride of the $Cd_xHg_{1-x}Te$ type with proportions $x_1$, $x_2$ of cadmium respectively between 0.6 and 0.33, and between 0.42 and 0.2. The thicknesses of the first and of the second sublayer 303, 304 are respectively between 0.5 and 1 μm and between 0.5 and 2 μm. The first and the second sublayer have a second type of conductivity of which the majority carriers are electrons. The concentrations in majority carriers of the first and of the second sublayer are substantially identical and are between $10^{14}$ and $10^{15}$ cm$^{-3}$.

According to this possibility of the invention, the energy band gap of the second sublayer 304 can be suitable for allowing the absorption of the electromagnetic radiation in a second wavelength range of which the energy is less than the given wavelength range. With such a possibility, the structure 1 makes it possible, during operation, the detecting and measuring of a radiation of which the wavelength is included in the second wavelength range as a supplement to the measurement of the electromagnetic radiation at the given wavelength.

According to this possibility applied to the particular application the proportion $x_2$ in cadmium of the second sublayer 304 can be between 0.32 and 0.2 in order to provide a second wavelength range comprising the thermal radiation.

It is meant hereinabove by thermal radiation the infrared wavelength range between 3 and 10 μm.

According to an alternative of the invention not shown, the first and the second layer 303, 304 are separated from one another by an interface area of the first type of conductivity of which the majority carrier concentration is adapted for modifying the distribution of the electric field in the second subpart so that the latter has a mean carrier multiplication rate by micrometer that is greater than that of the first subpart, the second subpart having a mean carrier multiplication rate by micrometer that is greater by at least 3 times and preferentially 5 times, even 10 times, that of the first subpart. According to this alternative, the first and the second sublayer 303, 304 have substantially identical an energy band gaps and are of the second type of conductivity with a majority carrier concentration of the same order of magnitude.

The cavity 520 is arranged in the second layer 300 in such a way as to laterally delimit the second area 310. As such the cavity 520 passes through the second layer 300 over its entire thickness. The cavity 520 forms a means for the lateral delimitation of the second area 310.

The second sublayer 304 also comprises the third semiconductor area 410.

The third area 410 is of the second type of conductivity which is opposite the first type of conductivity. The third area 410 comprises a majority carrier concentration at least 10 times, and preferentially 50 times, more substantial than that of the second area 310.

The energy band gap of the third area 410 is substantially identical to that of the second subpart 322 of the second area 310.

In the particular application, the third area 410 has the same type of conductivity as that of the second area 310. The majority carrier concentration is between $10^{16}$ and $10^{18}$ cm$^{-3}$.

The second layer 300 is in contact on its face which is opposite the first layer 200 with the passivation layer 620.

The passivation layer 620 extends along the second layer 300. The passivation layer 620 is preferentially formed in an insulating material, such as for example silicon oxide.

The passivation layer 620 has a through-opening in communication with the part of the second layer 300 comprising the third area 410.

In the particular application, the passivation layer 620 is made from zinc sulphide ZnS.

The electrical contact 710 is in contact with the third area 410 through the opening made in the passivation layer 620.

The electrical contact 710 is formed in a conductor material, generally metal, adapted for forming an ohmic contact with the third semiconductor area 410.

It can finally be noted that the structure 1 also comprises, although this is not shown in FIG. 1, a second means of polarisation, which can be an electrical contact passing through the passivation layer 620 and the second semiconductor layer 300 in order to be in electrical contact with the first semiconductor layer 200. The first semiconductor layer 200 having generally a majority carrier concentration that is sufficient to render it conductive, the structure 1 being a structure among a plurality, the second means can be a second collective electrical contact adapted for polarising several of the structures.

Such a structure 1, when it is a structure according to the particular application, can be formed by a method for manufacturing comprising the steps consisting in:
- providing a support 100 and the first layer 200, the latter being of the first type of conductivity and comprising a first and a second face 201, 202, the first layer comprising the first area 210,
- forming in contact with the second face 202 of the first layer 200 the second layer 300, the latter being of the second type of conductivity and comprising a first and a second face 301, 302, the second layer 300 being in contact with the first layer 200 by its first face 301; during this step, the composition of the layer 300 is varied in such a way as to form the first and the second sublayer 303, 304,
- forming the passivation layer 620 on the face of the second layer 300 which is opposite the first layer 200,
- implanting selectively with dopant elements a part of the second sublayer 304 of the second layer 300 in such a way as to form as such the third area 410,
- forming in the passivation layer 620 a through-opening in communication with the third area 410,
- forming the electrical contact 710 through the opening of the passivation layer 620 and in electrical contact with the third area 410,
- forming the second means of polarisation adapted for polarising the first area 210.

In operation, the structure 1 is highly reverse biased, i.e. that for a first and a third area 210, 410 each having a type of conduction wherein the majority carriers are respectively holes and electrons, the first area 210 is highly polarised negatively with regards to the third area 410. As such, as the semiconductor junction is located at the interface between the first and the second area 210, 310, and the second area 310 having a majority carrier low concentration with regards to the first area 210, the drop in potential is distributed mainly along the second semiconductor area 310.

When a photon of an electromagnetic radiation of which the wavelength is included in the given wavelength range penetrates into the first area 210, its absorption generates an electron-hole pair in the first area 210. The electron and the hole generated as such are separated from one another by the electric field present in the structure with the electron that transits to the second semiconductor area 310.

In the second area 310, due to the material from which it is composed and the electric field present therein, the electron will produce a multiple number of impact ionisations and therefore form a current of multiple electrons which is then collected by the third area 410.

More precisely, the electron, by first passing in the first subpart 321 of the second area 310, generates a reduced number of electrons by impact ionisation with a low reduction in the signal-to-noise ratio. The current formed as such then transits in the second subpart 322 wherein it generates a substantial number of carriers by impact ionisation. The current is as such substantially increased without any real reduction in the signal-to-noise ratio. The current after multiplication in the second subpart 322 of the second area 310 is then collected by the third area 410.

Figure 3:
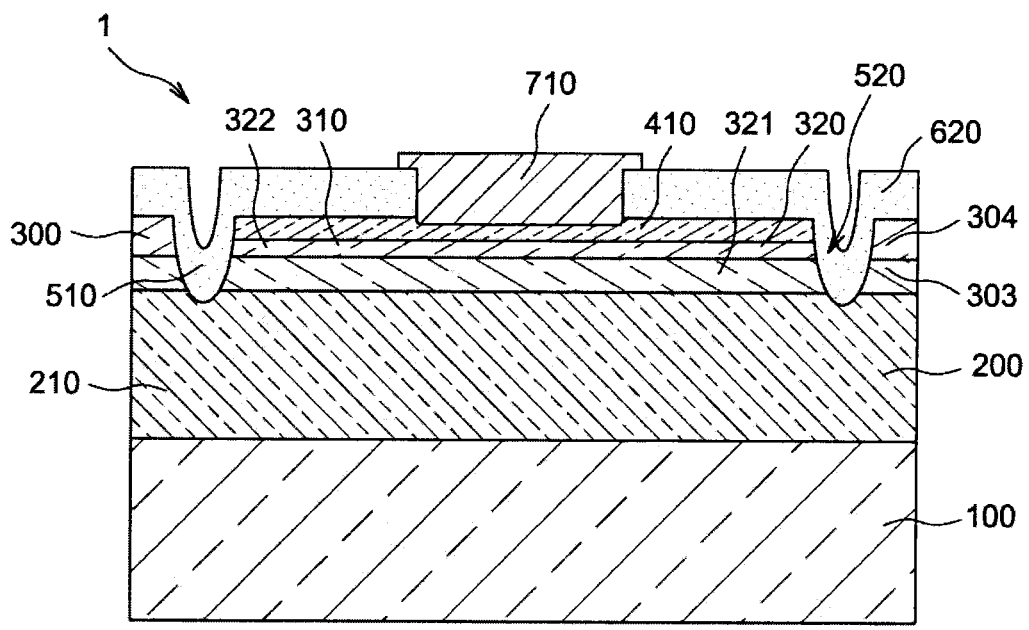
FIG. 3 shows a cross-section view of a structure according to a second embodiment of the invention wherein the structure comprises a third semiconductor area that extends over the entire width of the second semiconductor area.

FIG. 3 shows a structure according to a second embodiment wherein the third area 410 extends over the entire width of the second area 310. A structure 1 according to this second embodiment is differentiated from a structure 1 according to the first embodiment in that the third area 410 extends over the entire width of the second area 310 and in that the third area 410 acts as an interface between the passivation layer 620 and the second area 310.

The third area 410 is arranged in a part of the second sublayer 304 of the second layer 300.

A method for manufacturing a structure 1 according to this second embodiment is differentiated from a method for manufacturing a structure 1 according to the first embodiment in that during the step of implanting a part of the second sublayer 304 of the second layer 300, the implantation is carried out over the entire width of the second area 310 over a part of the height of the second sublayer 304 of the second layer 300.

A structure 1 according to this second embodiment operates according to a principle that is substantially identical to that of a structure 1 according to the first embodiment.

Figure 4:
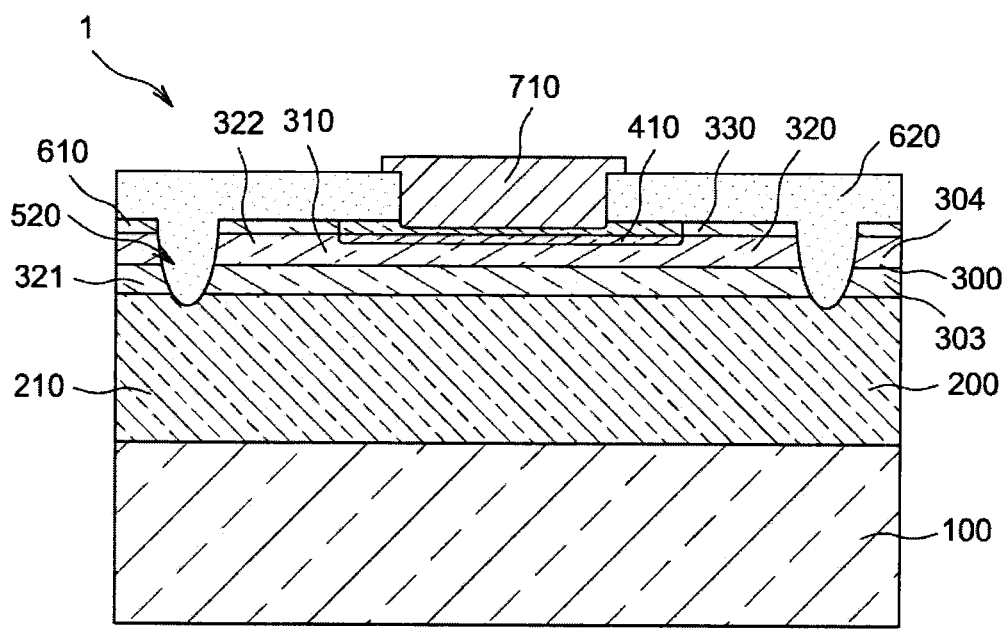
FIG. 4 shows a cross-section view of a structure according to a third embodiment of the invention wherein the structure comprises an adaptation layer, Identical, similar or equivalent parts of the different figures bear the same numerical references so as to facilitate passing from one figure to another.

FIG. 4 shows a structure 1 according to a third embodiment wherein the structure 1 comprises an adaptation layer 610. A structure 1 according to this third embodiment is differentiated from a structure 1 according to the first embodiment in that the second area 310 is arranged both in the second layer 300 and in the adaptation layer 610. The first and the second subpart 321, 322 form a part 320, referred to as major part, of the second area 310, which is comprised in the second layer 300.

In this third embodiment, the second semiconductor layer 300 comprises a second face 302 which is opposite the first face. The second layer 300 is in contact via its second face 302 with the adaptation layer 610.

The adaptation layer 610 is a third semiconductor layer which is adapted for forming a good interface between the second semiconductor layer 300 and the passivation layer 620. To this effect, the adaptation layer 610 has an intermediate an energy band gap between that of the major part 320 of the second area 310 and the energy band gap of the passivation layer 620.

The adaptation layer 610 is of the second type of conductivity. The adaptation layer 610 comprises, excluding its part forming the third area 410, a majority carrier d s which is of the same order of magnitude as that of the major part 320 of the second area 310 and preferentially substantially equal to that of the major part 320 of the second area 310. As such the adaptation layer 610 comprises a part 330 of the second area 310, referred to as minor part, through which the second area 310 is in contact with the passivation layer 610.

The second area 310 is as such formed substantially from a part 320, referred to as major, located in the second layer 300. It can also comprise a part 330, referred to as minor, located in the adaptation layer 610.

In the particular application, the adaptation layer 610 is formed in a mercury-cadmium telluride $Cd_xHg_{1-x}Te$ of which the proportion in cadmium x is between 0.7 and 0.4. In this same particular application, the adaptation layer 610 is of the same type of conductivity than that of the second area 310 and is therefore a type of conductivity for which the majority carriers are electrons. The concentration in s is substantially equal to that of the second area 310 and is therefore between $10^{14}$ and $10^{15}$ cm$^{-3}$.

The adaptation layer 610 comprises a part of the third area 410. The third area 410 is partially formed in the second layer 300, in contact with the second area 310, the remainder of the third area 410 being included in the adaptation layer 610.

According to an alternative of this possibility, the adaptation layer 610 can comprise a composition such that the adaptation layer has an energy band gap that gradually increases in the direction of the passivation layer 620. Such a possibility is particularly advantageous in that it makes it possible to prevent the forming of defects between the second layer 300 and the passivation layer 620.

The cavity 520, according to this third embodiment, also passes through the adaptation layer 610.

The invention claimed is:
1. An avalanche photodiode semiconductor structure for receiving an electromagnetic radiation in a given first wavelength range and comprising:
   a first semiconductor area, of a first type of conductivity having a first face for receiving the electromagnetic radiation and a second face opposite the first face, the semiconductor material in which is formed the first semiconductor area having an energy band gap suitable for allowing absorption of the electromagnetic radiation,
   a second semiconductor area, in contact with the second face of the first semiconductor area, the second semiconductor area having a majority carrier concentration that is less than a carrier concentration of the first area, the second semiconductor area being suitable for providing a multiplication of carriers by impact ionisation that is preponderant for one type of carrier,
   a third semiconductor area, in contact with the second semiconductor area, the third semiconductor area being of a second type of conductivity opposite the first type of conductivity and having a majority carrier concentration that is greater than the majority carrier concentration of the second semiconductor area,
   the second semiconductor area comprises at least two subparts, a first subpart through which the second semiconductor area is in contact with the first semiconductor area and a second subpart connecting the first subpart to the third semiconductor area, the second subpart being suitable for having a mean carrier multiplication rate by micrometer that is greater than the mean carrier multiplication rate of the first subpart,
   wherein the second subpart is made from a semiconductor material having an energy band gap that is less than energy band gap of the semiconductor material in which is formed the first subpart to have the mean carrier multiplication rate by micrometer greater than that of the first subpart,
   wherein the first and the second subpart are made from mercury-cadmium tellurides of $Cd_xHg_{1-x}Te$ type with proportions x in cadmium that are different from one another, and
   wherein the first and the second subpart of the first semiconductor area are both layers of which the minimum thickness is greater than 200 nm.

2. The avalanche photodiode semiconductor structure according to claim 1, wherein the first, second, and third semiconductor areas are all three made from mercury-cadmium tellurides of $Cd_xHg_{1-x}Te$ type with proportions x in cadmium that are different from one another, with the first type of conductivity being a type of conductivity wherein the majority carriers are holes, providing in this way that the impact ionisation in the second semiconductor area is preponderant for electrons, the first and the second subpart are made from mercury-cadmium tellurides of $Cd_xHg_{1-x}Te$ type with proportions x in cadmium that are different from one another.

3. The avalanche photodiode semiconductor structure according to claim 1, wherein the first subpart has a gain in multiplication of carriers between 2 and 10, the second subpart having a gain in multiplication of carriers between 10 and 500.

4. The avalanche photodiode semiconductor structure according to claim 1, wherein at least the second subpart of the second semiconductor area is of the second type of conductivity.

5. The avalanche photodiode semiconductor structure according to claim 1, further receiving an electromagnetic radiation in a second wavelength range of energies less than those of the first wavelength range of energies, the second subpart of the second semiconductor area comprising an energy band gap less than energy band gap of the first semiconductor area and of the first subpart, the energy band gap of the second subpart of the second semiconductor area being suitable for allowing absorption of the electromagnetic radiation in the second wavelength range.

6. A method for manufacturing an avalanche photodiode semiconductor structure according to claim 1 comprising:
   providing a first semiconductor area of a first type of conductivity having a first face for receiving an electromagnetic radiation in a given wavelength range, and a second face opposite the first face, the semiconductor material in which is formed the first semiconductor area having an energy band gap suitable for allowing absorption of the electromagnetic radiation,
   forming a second semiconductor area in contact with the second face of the first semiconductor area, the second semiconductor area having a majority carrier concentration that is less than a majority carrier concentration of the first semiconductor area, the second semiconductor area being suitable for providing a multiplication of carriers by impact ionisation that is preponderant for one type of carrier, the second semiconductor area comprising at least two subparts, a first subpart through which the second semiconductor area is in contact with the first semiconductor area and a second subpart for connecting the first subpart to a third semiconductor area, the second subpart being suited for having a mean carrier multiplication rate by micrometer that is more substantial than the mean carrier multiplication rate by micrometer of the first subpart, with the second subpart being made from a semiconductor material having an energy band gap that is less than an energy band gap of the semiconductor material in which is formed the first subpart to have the mean carrier multiplication rate by micrometer greater than that of the first subpart, the first and the second subpart being made from mercury-cadmium tellurides of $Cd_xHg_{1-x}Te$ type with proportions x in cadmium that are different from one another, with the first and the second subpart of the first semiconductor area being both layers of which the minimum thickness is greater than 200 nm,
   forming a third semiconductor area in contact with the second semiconductor area, the third semiconductor area being of a second type of conductivity opposite the first type of conductivity and having a majority carrier concentration that is greater than majority carrier concentration of the second semiconductor area.

\* \* \* \* \*